(12) United States Patent
Abe et al.

(10) Patent No.: US 10,026,523 B2
(45) Date of Patent: Jul. 17, 2018

(54) CONDUCTOR AND METHOD OF MANUFACTURING THE SAME

(71) Applicant: ALPS ELECTRIC CO., LTD., Tokyo (JP)

(72) Inventors: Yui Abe, Miyagi-ken (JP); Yoshihiro Taguchi, Miyagi-ken (JP); Mitsuo Bito, Miyagi-ken (JP); Yoshiyuki Asabe, Miyagi-ken (JP); Yasuyuki Kitamura, Miyagi-ken (JP); Tomoyuki Yamai, Miyagi-ken (JP); Koji Oguma, Miyagi-ken (JP); Tomofumi Oba, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 510 days.

(21) Appl. No.: 14/685,964

(22) Filed: Apr. 14, 2015

(65) Prior Publication Data

US 2015/0221413 A1 Aug. 6, 2015

Related U.S. Application Data

(63) Continuation of application No. PCT/JP2013/080089, filed on Nov. 7, 2013.

(30) Foreign Application Priority Data

Nov. 8, 2012 (JP) ................................. 2012-245978

(51) Int. Cl.
*H01B 5/14* (2006.01)
*B82Y 30/00* (2011.01)
(Continued)

(52) U.S. Cl.
CPC ................ *H01B 5/14* (2013.01); *B82Y 30/00* (2013.01); *C23C 14/34* (2013.01); *H01B 1/02* (2013.01);
(Continued)

(58) Field of Classification Search
CPC ....................................................... H01B 5/14
See application file for complete search history.

(56) References Cited

U.S. PATENT DOCUMENTS

2004/0066484 A1 4/2004 Tokailin et al.
2008/0259262 A1* 10/2008 Jones ..................... B82Y 10/00
349/139
(Continued)

FOREIGN PATENT DOCUMENTS

CN 102087885 A 6/2011
CN 102751043 10/2012
(Continued)

OTHER PUBLICATIONS

International Search Report dated Dec. 10, 2013 from International Application No. PCT/JP2013/080089.

*Primary Examiner* — Elizabeth A Robinson
(74) *Attorney, Agent, or Firm* — Beyer Law Group LLP

(57) ABSTRACT

A conductor includes: a transparent conductive film which is formed on a transparent substrate and includes a silver nanowire; and a metal film of which at least a portion is formed to overlap the transparent conductive film, in which a portion in which the transparent conductive film and the metal film overlap each other includes a buffer film which has adhesion to each of the transparent conductive film and the metal film and does not impede conduction between the transparent conductive film and the metal film. Preferably, the buffer film is, for example, an ITO film, and at this time, an upper surface of the transparent conductive film is a reverse-sputtered surface.

7 Claims, 3 Drawing Sheets

(51) Int. Cl.
*H01L 31/0224* (2006.01)
*H01L 31/18* (2006.01)
*H01B 1/02* (2006.01)
*H01L 51/00* (2006.01)
*H05K 1/09* (2006.01)
*H05K 3/38* (2006.01)
*C23C 14/34* (2006.01)
*B82Y 40/00* (2011.01)
*H01L 51/10* (2006.01)
*H01L 51/52* (2006.01)
*H01L 51/44* (2006.01)

(52) U.S. Cl.
CPC .. *H01L 31/0224* (2013.01); *H01L 31/022466* (2013.01); *H01L 31/1884* (2013.01); *H01L 51/0021* (2013.01); *H05K 1/09* (2013.01); *H05K 3/388* (2013.01); *B82Y 40/00* (2013.01); *H01L 51/102* (2013.01); *H01L 51/442* (2013.01); *H01L 51/5206* (2013.01); *H05K 2201/0108* (2013.01); *H05K 2201/0326* (2013.01); *H05K 2201/0338* (2013.01); *H05K 2201/10128* (2013.01); *Y02E 10/50* (2013.01); *Y10T 428/31663* (2015.04); *Y10T 428/31678* (2015.04)

(56) References Cited

U.S. PATENT DOCUMENTS

| | | | |
|---|---|---|---|
| 2009/0046078 A1* | 2/2009 | Kent | G06F 3/044 345/176 |
| 2010/0147684 A1 | 6/2010 | Park et al. | |
| 2011/0291968 A1 | 12/2011 | Kawazoe et al. | |
| 2012/0088189 A1 | 4/2012 | Miyagishima et al. | |
| 2012/0269960 A1 | 10/2012 | Fujino et al. | |

FOREIGN PATENT DOCUMENTS

| | | |
|---|---|---|
| JP | 2007-323089 | 12/2007 |
| JP | 2010-507199 | 3/2010 |
| JP | 2012-000924 | 1/2012 |
| KR | 10-2010-0067972 | 6/2010 |
| WO | WO 2009/078263 | 6/2009 |

* cited by examiner

CONDUCTOR AND METHOD OF MANUFACTURING THE SAME

CLAIM OF PRIORITY

This application is a Continuation of International Application No. PCT/JP2013/080089 filed on Nov. 7, 2013, which claims benefit of Japanese Patent Application No. 2012-245978 filed on Nov. 8, 2012. The entire contents of each application noted above are hereby incorporated by reference.

BACKGROUND OF THE INVENTION

1. Field of the Invention

The present invention relates to adhesion between a transparent conductive film including silver nanowires and a metal film.

2. Description of the Related Art

In Japanese Unexamined Patent Application Publication No. 2010-507199, a conductor in which a transparent conductive film including silver nanowires is formed on a substrate is disclosed.

However, the silver nanowires are dispersed in the transparent conductive film (refer to [0053], [0054], [0103], [0104], and the like in Japanese Unexamined Patent Application Publication No. 2010-507199). In order to secure dispersibility as described above, the silver nanowires are held in a transparent resin, and the surface of the transparent conductive film practically becomes an organic film.

Therefore, when a metal film is formed on the transparent conductive film, there is a problem in that adhesion between the transparent conductive film and the metal film is insufficient and thus the metal film is easily separated.

SUMMARY OF THE INVENTION

The present invention provides a conductor capable of enhancing adhesion between a transparent conductive film and a metal film, and a method of manufacturing the same.

According to an aspect of the present invention, there is provided a conductor including: a substrate; a transparent conductive film which is formed on the substrate and includes a silver nanowire; and a metal film of which at least a portion is formed to overlap the transparent conductive film, in which a portion in which the transparent conductive film and the metal film overlap each other includes a buffer film which has adhesion to each of the transparent conductive film and the metal film and does not impede conduction between the transparent conductive film and the metal film.

According to another aspect of the present invention, there is provided a method of manufacturing a conductor, including: a step of forming, on a transparent conductive film including a silver nanowire formed on a substrate, a buffer film which has adhesion to each of the transparent conductive film and a metal film that is formed in a subsequent step and does not impede conduction between the transparent conductive film and the metal film; and a step of forming at least a portion of the metal film on the buffer film.

According to the aspects of the present invention, since the buffer film which has adhesion to each of the transparent conductive film and the metal film and does not impede the conduction between the transparent conductive film and the metal film is interposed between the transparent conductive film and the metal film, the adhesion between the transparent conductive film and the metal film can be enhanced while maintaining good conductivity therebetween.

In addition, in the present invention, it is preferable that the buffer film is formed of a transparent metal oxide. It is preferable that the transparent metal oxide is ITO. Accordingly, the adhesion between the transparent conductive film and the metal film can be effectively enhanced.

In addition, in the present invention, it is preferable that reverse sputtering is performed on an upper surface of the transparent conductive film, and the buffer film is formed on the upper surface. That is, it is preferable that the upper surface of the transparent conductive film is a reverse-sputtered surface and the buffer film is formed on the reverse-sputtered surface. Accordingly, the adhesion between the transparent conductive film and the metal film can be more effectively enhanced.

Otherwise, in the present invention, it is preferable that the buffer film is an organic material having a functional group which is bonded to each of the transparent conductive film and the metal film. At this time, it is preferable that the organic material is a triazine compound having an alkoxy group and a thiol group, or an alkoxy group and an azide group.

In addition, the triazine compound has a structure shown in Chem. 5 or Chem. 6.

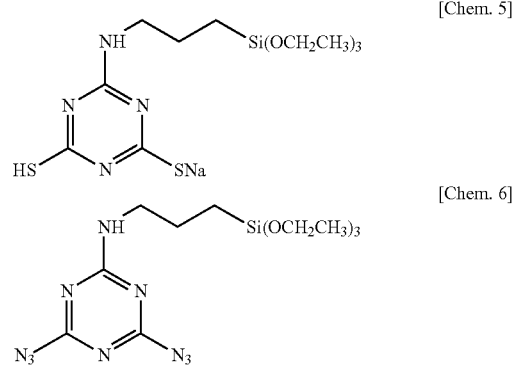

Accordingly, the adhesion between the transparent conductive film and the metal film can be effectively enhanced.

In addition, in the present invention, it is preferable that a heat treatment step is performed on the buffer film. Accordingly, the adhesion between the transparent conductive film and the metal film can be more effectively enhanced.

DESCRIPTION OF THE PREFERRED EMBODIMENTS

Figure 1A:
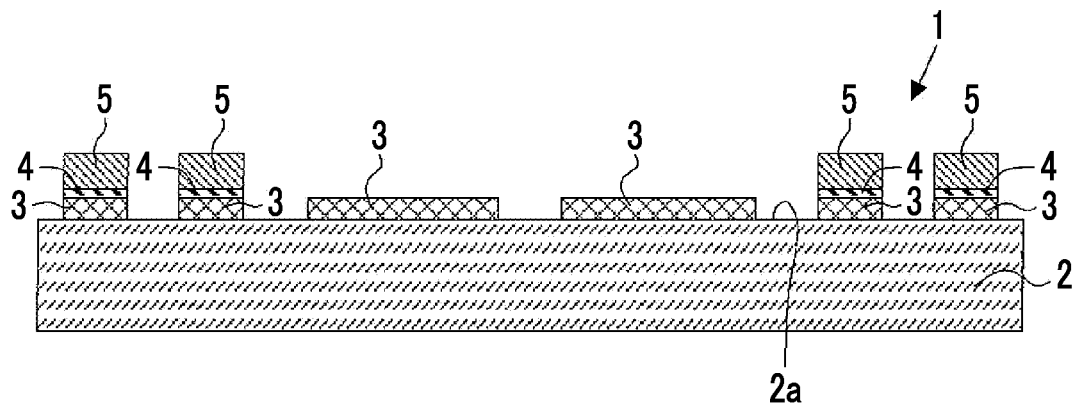
FIGS. 1A and 1B are longitudinal sectional views of a conductor in an embodiment.

FIG. 1A is a longitudinal sectional view of a conductor in an embodiment.

A conductor 1 illustrated in FIG. 1A is configured to include a transparent substrate 2, transparent conductive films 3 which are formed on an upper surface 2a of the transparent substrate 2, buffer films 4 which are formed on the transparent conductive films 3, and metal films 5 which are formed on the buffer films 4.

The conductor 1 may have a film shape having flexibility, and may also have a plate shape or a panel shape having high stiffness.

In this specification, "transparency" and "light-transmitting property" indicate a state where the visible light transmittance is 50% or higher (preferably 80% or higher).

In FIG. 1A, the transparent conductive films 3 are patterned on the transparent substrate 2 in a transparent electrode shape. The transparent conductive film 3 may be partially formed on the transparent substrate 2 by being patterned as illustrated in FIG. 1A, and may also be formed on the entire upper surface 2a of the transparent substrate 2. In addition, the transparent conductive films 3 are illustrated in a state of being separated from each other at a position of the longitudinal section illustrated in FIG. 1A. However, the transparent conductive films 3 may also be integrally formed or be electrically connected to each other via other conductive films at positions that are not illustrated.

The use of the conductor 1 illustrated in FIG. 1A is not limited. For example, the conductor 1 is used as a part of an input display device. For example, a liquid crystal display or the like is disposed on the lower side of the conductor 1, and the center portion in the transparent conductive films 3 illustrated in FIG. 1A, where the metal films 5 are not disposed, serves as an input display portion. Accordingly, the transparent conductive films 3 positioned in the center portion are, for example, transparent electrodes which generate a change in capacitance between the transparent conductive films 3 and an operating body such as a finger. In addition, portions on the transparent conductive films 3 which are positioned on both sides of FIG. 1A and overlap the metal films 5 are non-display regions, and for example, form wiring portions which are electrically connected to the transparent electrodes in the center portion.

A configuration in which a display panel is disposed on the surface of the conductor 1 illustrated in FIG. 1A via a transparent adhesive layer (not illustrated) may also be employed. Furthermore, the lower surface side of the transparent substrate 2 illustrated in FIG. 1A may serve as an input operation surface.

The transparent substrate 2 illustrated in FIG. 1A is formed of a film-shaped transparent substrate such as polyethylene terephthalate (PET), a glass substrate, or the like. The material of the transparent substrate 2 is not particularly limited. In addition, although the transparent substrate 2 is used in FIG. 1A, a substrate which is not transparent, for example, a translucent substrate may also be used.

Figure 1B:
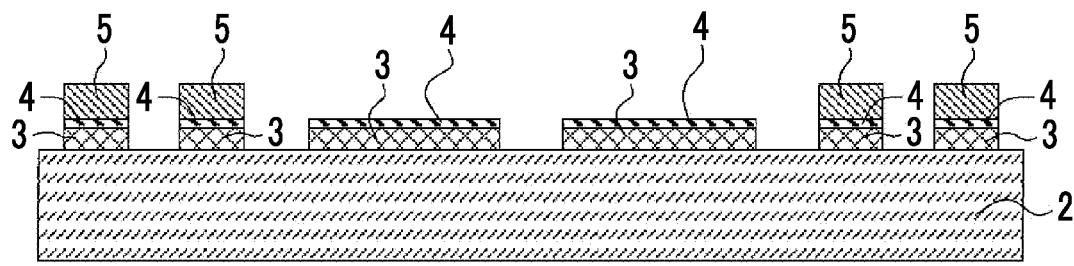
Figure 1C:
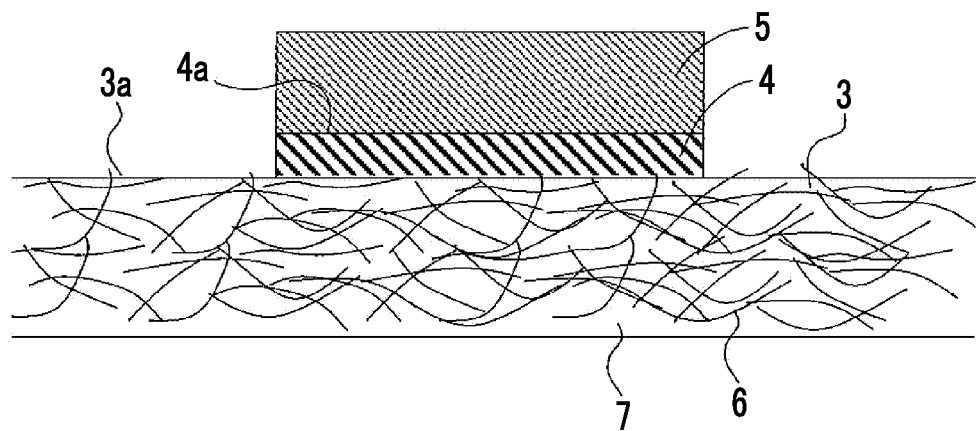
FIG. 1C is an enlarged schematic view illustrating a portion of the conductor.

The transparent conductive film 3 illustrated in FIG. 1A is a transparent conductive film which includes silver nanowires. As illustrated in FIG. 1C, a silver nanowire 6 has a line-shaped structure which is made of silver or a silver alloy. As illustrated in FIG. 1C, the silver nanowires 6 are present in a transparent resin layer 7 in a dispersed manner, and conductivity in the surface is maintained by contact between portions of the silver nanowires 6.

As illustrated in FIG. 1C, the silver nanowires 6 are dispersed in the transparent resin layer 7. The dispersibility of the silver nanowire 6 is maintained by the resin layer 7. The material of the resin layer 7 is not particularly limited, and for example, the resin layer 7 is made of a polyester resin, an acrylic resin, or a polyurethane resin.

As illustrated in FIG. 1A, the metal films 5 are formed on the transparent conductive films 3 which are positioned on both sides of the transparent substrate 2 among the transparent conductive films 3, via the buffer films 4. The buffer film 4 is an intermediate film which has adhesion to each of the transparent conductive film 3 and the metal film 5 and does not impede conduction between the transparent conductive film 3 and the metal film 5.

The metal film 5 is, for example, a Cu film. Particularly, the buffer film 4 can enhance the adhesion between the metal film 5 and the transparent conductive film 3 including the silver nanowires. In addition, the material of the metal film 5 is not particularly limited, and Al, Ag, Au, Ni, or the like other than Cu may also be selected.

In FIG. 1A, the buffer film 4 is provided only between the transparent conductive film 3 and the metal film 5. However, as illustrated in FIG. 1B, the buffer film 4 may remain on the upper surface of the transparent conductive film 3 which does not overlap the metal film 5. According to a manufacturing method which will be described later, the portions of the buffer films 4 which do not overlap the metal films 5 can be removed by an etching process. Otherwise, depending on etching conditions such as an etchant which is used, the portions of the buffer films 4 which do not overlap the metal film 5 may be allowed to remain on the upper surfaces of the transparent conductive films 3. At this time, the buffer film 4 is a very thin transparent film, and thus a good light-transmitting property can be secured even when the buffer film 4 remains on the transparent conductive film 3.

It is preferable that the buffer film 4 is made of a transparent metal oxide. As the transparent metal oxide, an inorganic transparent conductive material such as ITO (indium tin oxide), ZnO, or $SnO_2$ may be used, and among these, it is particularly preferable to select ITO. Accordingly, the adhesion between the transparent conductive film 3 and the metal film 5 can be effectively enhanced.

In addition, it is appropriate that reverse sputtering is performed on an upper surface 3a (see FIG. 1C) of the transparent conductive film 3, and thereafter the buffer film 4 which is made of the transparent metal oxide (particularly, ITO) is formed on the upper surface 3a which is the reverse-sputtered surface. Reverse sputtering indicates a method of reforming the surface by generating plasma in the vicinity of the surface of the transparent conductive film 3 in an inert gas atmosphere or the like. Reverse sputtering is performed by reversing the voltage between a target and a substrate, which is applied during typical sputtering.

The upper surface 3a of the transparent conductive film 3 is reformed by the reverse sputtering so that the adhesion between the transparent conductive film 3 and the metal film 5 via the buffer film 4 can be effectively enhanced. It is thought that due to the reverse sputtering, the amount (exposure area) of the silver nanowires 6 which are made of metal and are exposed from the upper surface 3a of the transparent conductive film 3 is increased, or the upper surface 3a of the transparent conductive film 3 is appropriately roughened.

It is preferable that the thickness of the buffer film 4 made of the above-mentioned transparent metal oxide (particularly, ITO) is about 2 nm to 100 nm. In addition, in a case where the buffer film 4 made of the transparent metal oxide (particularly, ITO) is formed without performing the reverse sputtering on the upper surface 3a of the transparent conductive film 3, the thickness of the buffer film 4 is preferably about 20 nm to 100 nm. Accordingly, the adhesion between the transparent conductive film 3 and the metal film 5 can be effectively enhanced.

In addition, it is preferable that reverse sputtering is performed on an upper surface 4a (see FIG. 1C) of the buffer film 4 and thereafter the metal film 5 is formed thereon. Accordingly, the adhesion between the transparent conductive film 3 including the silver nanowires and the metal film 5 can be more effectively enhanced. In addition, conductivity between the transparent conductive film 3 and the metal film 5 via the buffer film 4 can be maintained at a good level.

Otherwise, the buffer film 4 may be made of an organic material having a functional group which is bonded to each of the transparent conductive film 3 and the metal film 5. The film thickness of the buffer film 4 is very small due to a process which will be described later, and the transparent conductive film 3 and the metal film 5 are in a state of being electrically connected to each other via the buffer film 4. Otherwise, the buffer film 4 is intermittently formed on the upper surface 3a of the transparent conductive film 3, and the transparent conductive film 3 and the metal film 5 are in a state of being electrically connected to each other via the buffer film 4.

It is preferable that the above-mentioned organic material is a triazine compound having an alkoxy group and a thiol group, or an alkoxy group and an azide group. Specifically, it is appropriate that the triazine compound has a structure shown in Chem. 7 or Chem. 8 as follows.

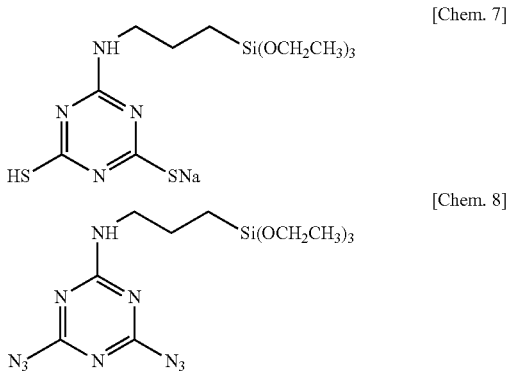

[Chem. 7]

[Chem. 8]

Accordingly, the adhesion between the transparent conductive film and the metal film can be effectively enhanced.

In addition, it is preferable that a heat treatment is performed on the organic material in order to more effectively enhance the adhesion. It is appropriate that the heat treatment is performed at about 100° C. for several to tens of minutes. The heat treatment may be performed during the process of forming the buffer film 4 using the triazine compound shown in Chemical Formula 7 or Chemical Formula 8 shown above, or may be performed after the process of forming the buffer film 4 (any of before, during, and after the formation of the metal film 5).

FIGS. 2 to 6 are diagrams (longitudinal sectional views) illustrating processes in a method of manufacturing the conductor 1 in this embodiment.

Figure 2:
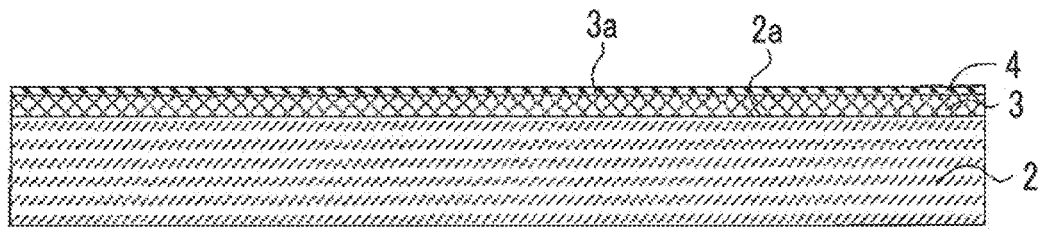
FIG. 2 is a diagram (longitudinal sectional view) illustrating a process in a method of manufacturing the conductor in this embodiment.

In the process illustrated in FIG. 2, the buffer film 4 is formed on the upper surface 3a of the transparent conductive film 3 which is formed on the transparent substrate 2 such as PET and includes the silver nanowires. The buffer film 4 has adhesion to both the transparent conductive film 3 and the metal film 5 which will be formed in the subsequent process, and has a function of not impeding the conduction between the transparent conductive film 3 and the metal film 5.

As illustrated in FIG. 2, the transparent conductive film 3 is formed on substantially the entire upper surface 2a of the transparent substrate 2. Here, the transparent conductive film 3 may also be partially formed on the upper surface 2a of the transparent substrate 2 at the initial stage.

A conductive substrate in which the transparent conductive film 3 including the silver nanowires is formed on the transparent substrate 2 in advance may be prepared, or the transparent conductive film 3 may be formed on the transparent substrate 2 by applying a coating liquid including the silver nanowires onto the transparent substrate 2 and performing a predetermined heat treatment thereon.

It is preferable that the buffer film 4 illustrated in FIG. 2 is formed of the transparent metal oxide. In addition, it is more preferable that the transparent metal oxide is formed of ITO. Furthermore, it is preferable that the reverse sputtering is performed on the upper surface 3a of the transparent conductive film 3 and thereafter the buffer film 4 made of the transparent metal oxide (particularly, ITO) is formed on the upper surface 3a by an existing method such as a sputtering method. As for the reverse sputtering conditions, the pressure is controlled to be about 50 mTorr to 500 mTorr and the power is controlled to be 0.01 mW/cm$^2$ to 10 mW/cm$^2$ in an inert atmosphere such as Ar or a vacuum atmosphere.

Figure 3:
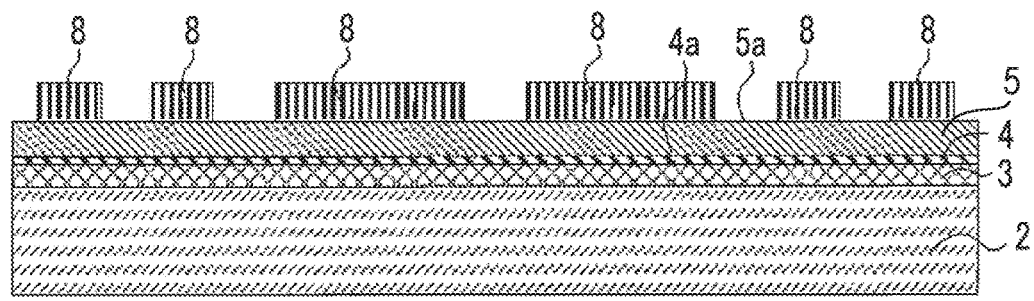
FIG. 3 is a diagram (longitudinal sectional view) of a process performed subsequent to FIG. 2.

Otherwise, the buffer film 4 may also be formed of an organic material having a functional group which is bonded to each of the transparent conductive film 3 and the metal film 5 formed in the process of FIG. 3. At this time, it is preferable that the above-described organic material is formed of a triazine compound having an alkoxy group and a thiol group, or an alkoxy group and an azide group. Specifically, it is preferable that the organic material is formed of the triazine compound having the structure shown in Chemical Formula 7 or Chemical Formula 8 shown above. In addition, it is preferable that a heat treatment is performed on the organic material. The heat treatment may be performed during the process of forming the organic material or after the process of forming the organic material, for example, after the formation of the metal film 5 in the process of FIG. 3.

The formation of the buffer film 4 using the organic material is performed through an immersion process of a liquid containing the organic material, a cleaning process, a drying process, and the like.

In FIG. 2, the buffer film 4 is formed on the entire upper surface 3a of the transparent conductive film 3. However, the buffer film 4 may also be formed only on a predetermined region of the upper surface 3a of the transparent conductive film 3 in the process of FIG. 2.

In the process illustrated in FIG. 3, the metal film 5 is formed on the buffer film 4 by an existing method such as a sputtering method. In FIG. 3, the metal film 5 is formed on the entire upper surface 4a of the buffer film 4, and may also be formed only on a predetermined region.

It is preferable that the metal film 5 is formed of a Cu film.

Subsequently, a resist layer 8 is applied to an upper surface 5a of the metal film 5. A prebaking treatment or an exposing and developing treatment is performed on the resist layer 8 such that the resist layer 8 having a pattern illustrated in FIG. 3 remains.

Figure 4:
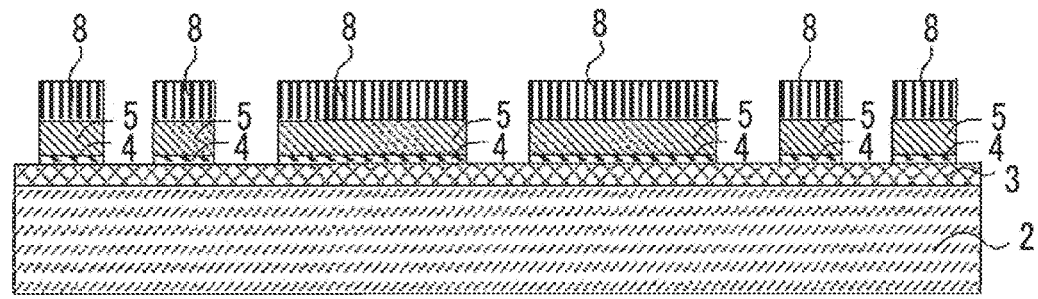
FIG. 4 is a diagram (longitudinal sectional view) of a process performed subsequent to FIG. 3.

Subsequently, in the process illustrated in FIG. 4, the metal film 5 which is not covered by the resist layer 8 is removed by etching. By the etchant used at this time, the buffer film 4 which is exposed through the removal of the metal film 5 may be removed. Accordingly, as illustrated in FIG. 4, the surface of the transparent conductive film 3 is in a state of being exposed. In addition, in the process of FIG. 4, the exposed buffer film 4 may not be removed by etching.

Figure 5:
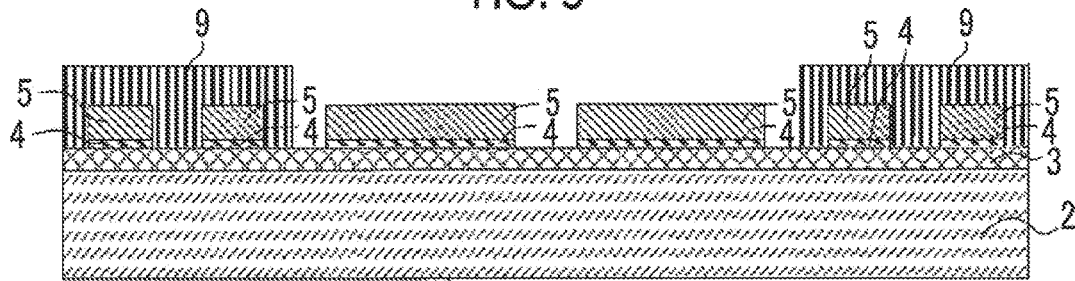
FIG. 5 is a diagram (longitudinal sectional view) of a process performed subsequent to FIG. 4.

Next, in the process of FIG. 5, the resist layer 8 is removed, and a resist layer 9 is subsequently applied to the entire surface. A prebaking treatment or an exposing and developing treatment is performed on the resist layer 9 such that the resist layer 9 having a pattern illustrated in FIG. 5 remains.

Subsequently, in FIG. 6, the metal film 5 which is not covered by the resist layer 9 is removed by etching. At this time, the buffer film 4 which is exposed through the removal of the metal film 5 may also be removed by the etching process.

Figure 6:
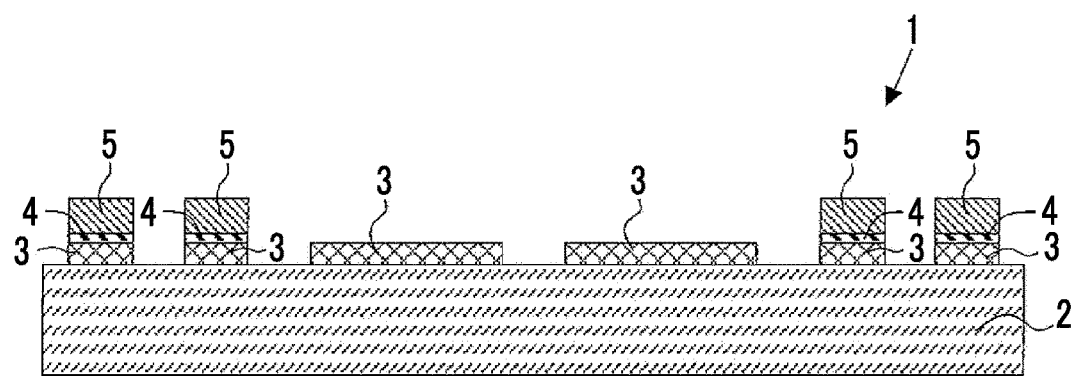
FIG. 6 is a diagram (longitudinal sectional view) of a process performed subsequent to FIG. 5.

Furthermore, by removing the resist layer 9, the conductor 1 illustrated in FIG. 6 is completed.

In the manufacturing method described above, the metal film 5 is formed on the transparent conductive film 3 via the buffer film 4. Accordingly, the adhesion between the transparent conductive film 3 including the silver nanowires and the metal film 5 can be effectively enhanced.

In FIGS. 1A, 1B, and 1C, a configuration in which the entire metal film 5 overlaps the transparent conductive film 3 and the buffer film 4 is interposed therebetween in a portion in which the transparent conductive film 3 and the metal film 5 overlap each other is illustrated. Here, a configuration in which a portion of the metal film 5 overlaps the transparent conductive film 3 and the buffer film 4 is interposed therebetween in the overlapping portion may also be employed.

Examples

In an experiment, conductors of Comparative Examples 1 to 4 and Examples 1 to 8 were formed.

In all of the conductors, a common conductive substrate in which a transparent conductive film including silver nanowires is formed on a transparent substrate was used, and a Cu film having a film thickness of 150 nm was further formed as a metal film.

TABLE 1

| | | Cross-cut test results | |
|---|---|---|---|
| | Pre-treatment conditions | Edge | Center |
| Comparative Example 1 | Absent | C | C |
| Comparative Example 2 | UV-ozone | C | C |
| Comparative Example 3 | Excimer UV | C | C |
| Comparative Example 4 | Only reverse sputtering | C | C |
| Example 1 | ITO buffer film (20 nm) | B | B |
| Example 2 | ITO buffer film (100 nm) | B | B |
| Example 3 | Reverse sputtering & ITO buffer film (2 nm) | A | A |
| Example 4 | Reverse sputtering & ITO buffer film (20 nm) | A | A |
| Example 5 | Reverse sputtering & ITO buffer film (100 nm) | A | A |
| Example 6 | Reverse sputtering & ITO buffer film (20 mm)=>leaving in atmosphere=> reverse sputtering | A | A |

TABLE 1-continued

| | | Cross-cut test results | |
|---|---|---|---|
| | Pre-treatment conditions | Edge | Center |
| Example 7 | TES treatment | A | A |
| Example 8 | P-TES treatment | A | A |

As shown in Table 1, in Comparative Example 1, before forming the metal film (Cu film), a pre-treatment was not performed on the transparent conductive film.

In addition, as shown in Table 1, in Comparative Example 2, the surface of the transparent conductive film was subjected to a surface treatment by UV-ozone, and thereafter the metal film (Cu film) was formed. In addition, in Comparative Example 3, an excimer UV treatment was performed on the surface of the transparent conductive film, and thereafter metal film (Cu film) was formed.

In addition, in Examples 1 and 2, reverse sputtering was not performed on the upper surface of the transparent conductive film.

As shown in Table 1, in Example 1, a buffer film made of ITO was formed on the upper surface of the transparent conductive film including the silver nanowires to a film thickness of 20 nm, and thereafter the metal film (Cu film) was formed on the buffer film. In addition, in Example 2, a buffer film made of ITO was formed on the upper surface of the transparent conductive film including the silver nanowires to a film thickness of 100 nm, and thereafter the metal film (Cu film) was formed on the buffer film.

In addition, as shown in Table 1, in Example 3, after reverse sputtering was performed on the upper surface of the transparent conductive film including the silver nanowires, a buffer film made of ITO was formed on the upper surface to a film thickness of 2 nm, and the metal film (Cu film) was subsequently formed on the buffer film. In addition, in Example 4, after reverse sputtering was performed on the upper surface of the transparent conductive film including the silver nanowires, a buffer film made of ITO was formed on the upper surface to a film thickness of 20 nm, and the metal film (Cu film) was subsequently formed on the buffer film. In addition, in Example 5, after reverse sputtering was performed on the upper surface of the transparent conductive film including the silver nanowires, a buffer film made of ITO was formed on the upper surface to a film thickness of 100 nm, and the metal film (Cu film) was subsequently formed on the buffer film. In addition, in Example 6, after reverse sputtering was performed on the upper surface of the transparent conductive film including the silver nanowires, a buffer film made of ITO was formed on the upper surface to a film thickness of 20 nm Subsequently, the resultant was removed from the sputtering device once and was left in the atmosphere for about one day. Thereafter, the resultant was put into the sputtering device again, the sputtering device was evacuated, reverse sputtering was performed on the upper surface of the buffer film, and then the metal film (Cu film) was formed on the buffer film.

As for the reverse sputtering conditions described above, in any of the above cases, the pressure was set to about 200 mTorr and the power was set to about 5 mW/cm$^2$ in an inert atmosphere (in Ar).

In addition, in Example 7, a buffer film made of the triazine compound (hereinafter, referred to as TES) expressed by Chemical Formula 7 shown above was formed on the upper surface of the transparent conductive film including the silver nanowires, and the metal film (Cu film)

was subsequently formed on the buffer film. In Example 7, the buffer film was formed through the processes of immersion in a (3%) aqueous solution of KOH, rinsing with H$_2$O, immersion in a TES/ethanol liquid, rinsing with H$_2$O, and a hot plate (80° C.) (TES treatment). Furthermore, after forming the metal film, a heat treatment was performed thereon at 100° C. for 10 minutes.

In addition, in Example 8, a buffer film made of the triazine compound (hereinafter, referred to as P-TES) expressed by Chemical Formula 8 shown above was formed on the upper surface of the transparent conductive film including the silver nanowires, and the metal film (Cu film) was subsequently formed on the buffer film. In Example 8, the buffer film was formed through the processes of immersion in P-TES/IPA (0.1%), drying with a dryer, UV irradiation, and rinsing with ethanol (P-TES treatment). Furthermore, after forming the metal film, a heat treatment was performed thereon at 100° C. for 10 minutes.

In addition, a cross-cut test (JIS K 5600-5-6) was performed on each of the samples of Comparative Examples 1 to 4 and Examples 1 to 8. The cross-cut test was performed on the center and the edge of each of the samples.

Here, A shown in Table 1 is the result of a case where no separation had occurred, B is the result of a case where separation was very partially seen, and C is the result of a case where separation was seen over the entire area.

As shown in Table 1, it was seen that Examples had better results in the cross-cut test than those of Comparative Examples, and had good adhesion between the transparent conductive film including the silver nanowires and the metal film (Cu film).

In addition, as shown in Table 1, it was seen that Examples 3 to 6 had obtained better adhesion than Examples 1 and 2. Therefore, it was seen that, by forming the buffer film made of ITO after performing reverse sputtering on the surface of the transparent conductive film, the adhesion between the transparent conductive film and the metal film could be more effectively enhanced. Furthermore, it was seen that, as in Example 6, even when the buffer film was left in the atmosphere once after being formed, the adhesion could be effectively enhanced by performing reverse sputtering on the upper surface of the buffer film.

In both of Example 7 in which the TES treatment was performed and Example 8 in which the P-TES treatment was performed, the heat treatment was performed, and thus it was seen that good adhesion could be obtained.

Next, in Comparative Example 1 in which the pretreatment was not performed, Example 9 in which the TES treatment was performed, and Example 10 in which the P-TES treatment was performed, elements of the surface of the transparent conductive film and the composition ratios thereof were obtained by XPS (X-ray photoelectron spectroscopy). The results are shown in Table 2.

TABLE 2

| | Detection element & composition ratio (at %) | | | | | |
|---|---|---|---|---|---|---|
| | C | N | O | Ag | Si | Others |
| Comparative Example 1 | 49.89 | 1.36 | 15.64 | 0.16 | — | 32.95 |
| Example 9 | 64.51 | 5.97 | 25.06 | 0.11 | 1.63 | 2.72 |
| Example 10 | 61.36 | 14.52 | 20.69 | 0.19 | 2.58 | 0.39 |

As shown in Table 2, in Example 9 and Example 10, Si included in the treatment liquid was detected.

In addition, in Example 9 and Example 10, a small amount of Ag that was detected in Comparative Example 1 in which the pre-treatment was not performed was detected.

From this, it was seen that by performing the TES treatment of Example 9 or performing the P-TES treatment of Example 10, the buffer film made of the organic material (triazine compound) was formed on the upper surface of the transparent conductive film. In addition, it is thought that the buffer film is very thin or is intermittently formed.

In addition, in Comparative Example 1, Example 9, and Example 10, haze values, Tt values (transmittances), and sheet resistances were measured. The results are shown in Table 3 as follows.

TABLE 3

| | Haze | Tt [%] | Sheet resistance [Ω/□] |
|---|---|---|---|
| Comparative Example 1 | 0.99 | 91.34 | 65.125 |
| Example 9 | 1.29 | 91.1 | 62.625 |
| Example 10 | 1.08 | 92.26 | 64.25 |

In addition, regarding the sheet resistance, a silver paste was applied to a region at 5 mm from both ends of a sheet in a size of 25 mm×50 mm, the resultant was baked at 120° C. for 30 minutes, and the bulk resistance thereof was obtained.

As shown in Table 3, each of the haze values, the Tt values, and the sheet resistances in the samples were substantially the same. As described above, it was seen that, in Examples, the adhesion between the transparent conductive film and the metal film could be enhanced while maintaining various properties such as the light-transmitting property and conductivity.

It should be understood by those skilled in the art that various modifications, combinations, sub-combinations and alterations may occur depending on design requirements and other factors insofar as they are within the scope of the appended claims or the equivalents thereof.

What is claimed is:

1. A conductor of an input device for an input display device, the conductor having an input display region and a non-display region, the conductor comprising:
   a substrate; and
   a patterned transparent conductive film formed on the substrate in the input display region and the non-display region, the transparent conductive film including a silver nanowire,
   wherein the non-display region of the conductor further comprises:
      a metal film formed over the transparent conductive film such that at least a portion thereof overlaps the transparent conductive film formed in the non-display region; and
      a buffer film made of a transparent metal oxide, provided between the transparent conductive film and the metal film, thereby forming a wiring portion having the metal film, the buffer film, and the transparent conductive film in the non-display region, the buffer film having adhesion to each of the transparent conductive film and the metal film, and not impeding conductivity between the transparent conductive film and the metal film,
   and wherein the input display region of the conductor comprises:

at least one transparent electrode which is the patterned transparent conductive film disposed in the input display region without the buffer film formed thereon.

2. The conductor according to claim 1, wherein the transparent metal oxide is ITO.

3. The conductor according to claim 1, wherein an upper surface of the transparent conductive film is a reverse-sputtered surface, and the buffer film is formed on the reverse-sputtered surface.

4. The conductor according to claim 1, wherein the metal film is formed of Cu.

5. A method of manufacturing a conductor of an input device for an input display, the conductor having an input display region and a non-display region, the method comprising:
   providing a substrate having a transparent conductive film including a silver nanowire formed thereon;
   forming a buffer film made of a transparent metal oxide on the transparent conductive film;
   forming a metal film on the buffer film formed on the transparent conductive film; and
   patterning the metal film, the buffer film, and the transparent conductive film, thereby providing in the input display region at least one transparent electrode formed of the transparent conductive film without the buffer film formed thereon, and providing in the non-display region a wiring portion formed of the transparent conductive film, the metal film, and the buffer film interposed therebetween,
   wherein the buffer film having adhesion to each of the transparent conductive film and the metal film, and not impeding conductivity between the transparent conductive film and the metal film.

6. The method of manufacturing a conductor according to claim 5, wherein the transparent metal oxide is formed of ITO.

7. The method of manufacturing a conductor according to claim 5, the patterning comprising:
   performing reverse sputtering on an upper surface of the transparent conductive film, the buffer film being formed on the upper surface.

\* \* \* \* \*